United States Patent
Porter et al.

(10) Patent No.: US 6,604,492 B2
(45) Date of Patent: Aug. 12, 2003

(54) VAPORIZER

(75) Inventors: George K. Porter, Maple Glen, PA (US); Seth B. Wolf, Warminster, PA (US); Charles W. Albrecht, Furlong, PA (US)

(73) Assignee: Porter Instrument Company, Inc., Hatfield, PA (US)

( * ) Notice: Subject to any disclaimer, the term of this patent is extended or adjusted under 35 U.S.C. 154(b) by 0 days.

(21) Appl. No.: 10/087,701

(22) Filed: Feb. 28, 2002

(65) Prior Publication Data

US 2002/0121249 A1 Sep. 5, 2002

Related U.S. Application Data

(60) Provisional application No. 60/271,947, filed on Feb. 28, 2001.

(51) Int. Cl.$^7$ .................................................. F22B 1/08
(52) U.S. Cl. ..................... 122/32; 392/386; 392/394; 392/397; 126/350.2; 261/157
(58) Field of Search .................. 122/32, 446; 392/401, 392/386, 388, 394, 396, 397, 398, 399; 126/350.2; 261/152, 157

(56) References Cited

U.S. PATENT DOCUMENTS

| | | | | | |
|---|---|---|---|---|---|
| 5,113,478 | A | * | 5/1992 | Nakashima et al. | 392/395 |
| 5,117,482 | A | * | 5/1992 | Hauber | 392/492 |
| 6,006,701 | A | * | 12/1999 | Nagano | 122/367.1 |
| 6,036,783 | A | * | 3/2000 | Fukunaga et al. | 118/724 |

* cited by examiner

*Primary Examiner*—Gregory Wilson
(74) *Attorney, Agent, or Firm*—RatnerPrestia

(57) ABSTRACT

A vaporizer is provided for delivering vapor streams such as high purity streams to a processing destination, such as a wafer processing chamber. The vaporizer includes a heated base having one or more seamless slots formed in one of its faces for carrying a liquid which is vaporized by heat from the heated plate. In one embodiment, the vaporizer includes an atomizer for atomizing the liquid prior to vaporization to reduce the temperature of vaporization. In one embodiment, the vaporizer includes a heat exchanger having cross-slots intersecting a plurality of seamless slots to reduce unvaporized liquid from exiting the vaporizer.

17 Claims, 14 Drawing Sheets

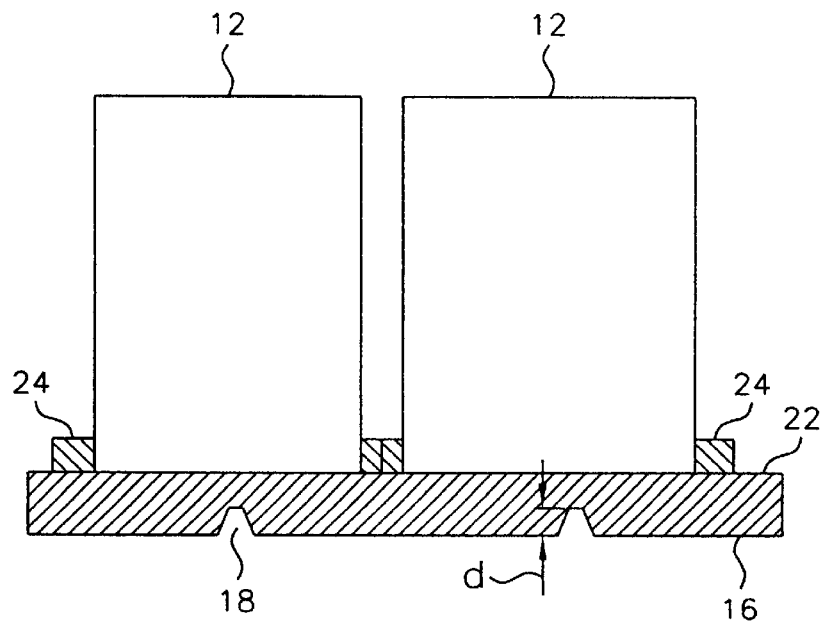
FIG. 5
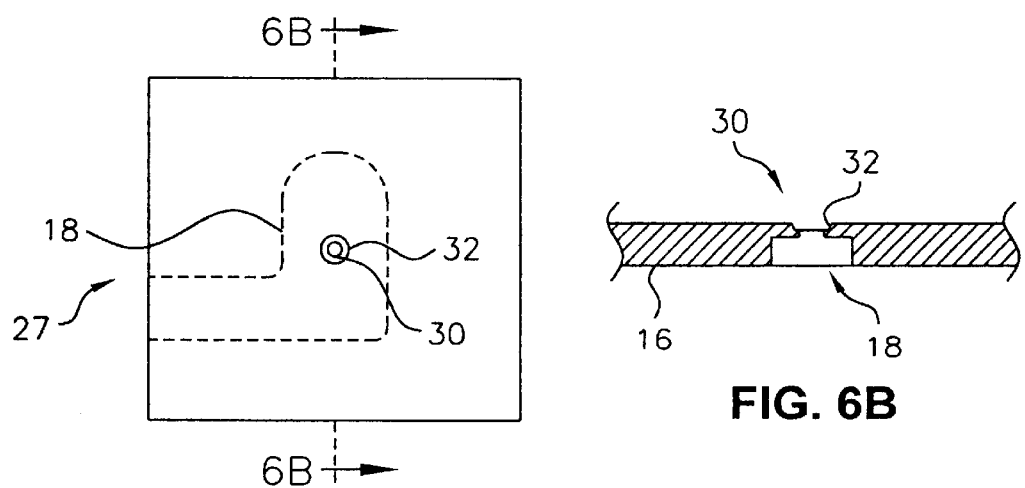
FIG. 6A
FIG. 6B

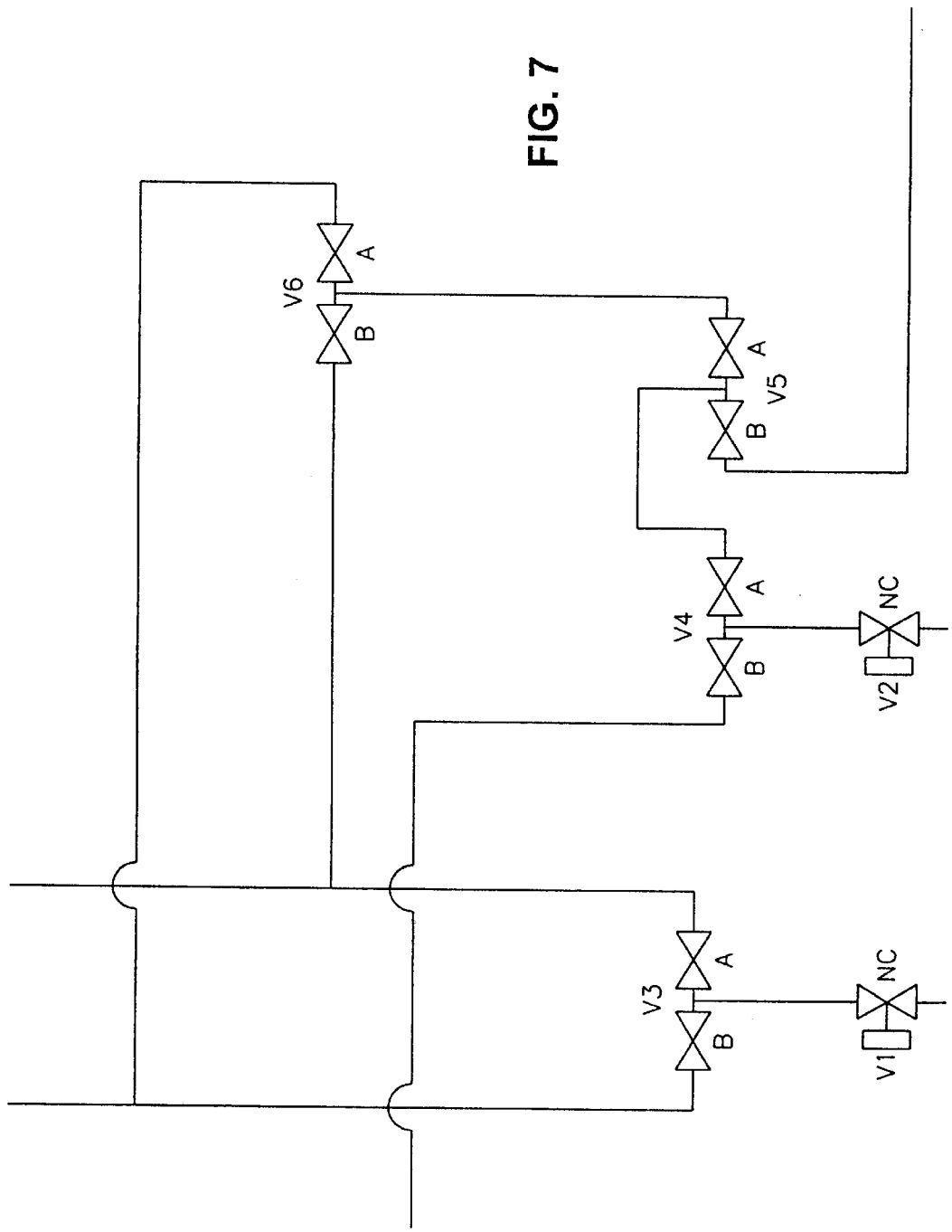

VAPORIZER

CROSS-REFERENCE TO RELATED APPLICATIONS

This application claims the benefit of the priority date of Provisional U.S. patent application Ser. No. 60/271,947 filed Feb. 28, 2001 for subject matter disclosed therein.

FIELD OF THE INVENTION

The present invention relates, in general, to a fluid delivery system. More particularly, this invention provides an integrated fluid delivery system (IFDS) for providing high purity fluid streams, such as for a wafer processing chamber.

BACKGROUND OF THE INVENTION

High purity fluid delivery systems are employed in demanding manufacturing environments such as the semiconductor manufacturing industry. The delivery systems are designed to precisely dispense fluids which may be hazardous in nature (i.e., corrosive, poisonous) and/or expensive. For example, in semiconductor processing/manufacturing, various stages such as low pressure chemical vapor deposition (LPCVD), oxidation, and plasma enhanced chemical vapor deposition (PECVD), require corrosive precursors such as boron, silicon and phosphorous to be delivered to a wafer processing chamber for the manufacture of semiconductor devices.

Typically, high purity fluid systems in the semiconductor manufacturing industry employ a complex network of tubing (plumbing) that require high integrity welds between tube sections and conduit assemblies for channeling the fluids to a variety of fluid control, metering, and operational devices. As the layout of each system is dependent upon the number and location of the control, metering and operational devices, the "system schematic" is equal in complexity to the number of high integrity welds and corresponding conduit arrangement.

As can be appreciated, the number of high cost conduit assembly (i.e., valving) and high integrity welding connections, as well as the increased complexity of the corresponding system schematic leads to liquid delivery systems which are costly to both maintain and manufacture. Indeed, bulky conduit assemblies requiring even a mere additional square foot can be cost prohibitive in the valuable real estate of clean room environments, where the cost to build per square foot is especially expensive.

Moreover, repairing a faulty weld or replacing a flow device component often necessitates disassembly of a substantial portion of the liquid delivery system. This also increases the down time of the process incorporating the component. For example, there is shown in FIG. 1, a typical prior art liquid delivery system 5. Liquid delivery system 5 utilizes a conduit assembly 7 which employs a plurality of conduit sections 10, high integrity welds (not shown) and flow devices 12 for delivering high purity liquid streams from system 5. Flow devices 12 can be any device known in the art for processing a fluid, but typically include flow controllers, valves, filters and pressure transducers. As shown in FIG. 1, conduit based system 7 requires a large degree of available area inside the cabinet of liquid delivery system 5. Thus, in the case where a particularly hard to reach component or weld requires maintenance and/or replacement, a significant portion of system 7 would need to be disassembled. As can be appreciated, conduit system 7 is complex and costly to assemble and operate. For example, conduit system 7 has a higher overall resistance to fluid flow than lesser complex systems, thus an increased "down time" is required to purge the system of fluids where necessary.

To provide a precise volume of fluid to a processing application, fluid delivery systems may comprise a flow controller. Typically, flow controllers couple a sensor for measuring flow volume with a valve for adjusting flow volume. Measuring the flow volume of an entire fluid stream, however, can lead to long response time. Some flow controllers employ a fluid bypass, measuring the flow volume of a small portion of the flow and inferring the flow volume in the bypass. These flow controllers, however, employ methods for maintaining the necessary pressure differential that are expensive, have high part counts that add tolerances and cost, or are difficult to manufacture yielding inadequate accuracy or repeatability. Examples of such bypass flow controllers include those using a bundle of tubes or a sintered metal slug.

Additionally, atomizing and/or vaporizing a liquid in a gas stream is often necessary in high purity fluid processing applications. For example, these processes may be employed to deposit high-purity, metal oxide films on a substrate. Moreover, the liquid mixtures may also be utilized for spray coating, spin coating and sol-gel deposition of materials. In particular, chemical vapor deposition (CVD) is an increasingly utilized high purity fluid delivery process for forming solid materials, such as coatings or powders by way of reactants in a vapor phase. Typically, a reactant vapor is created by heating a liquid to an appropriate temperature and bubbling a flow of carrier gas through the liquid (i.e. high purity fluid stream) to transport the vapor into a CVD chamber. Specifically, a gas stream and liquid stream are introduced into a single channel or conduit at a T-junction. The CVD system pumps a fluid stream at a steady, controlled rate into a hot region which may include ultrasonic energy for effecting the mixture components. However, this technique creates a dead volume of material upon discontinuance of the process. Further, bubbling can often be an unpredictable method of vaporization, in which the precise quantity of the liquid reactant is difficult to control.

Accordingly, there is a need for an atomizer which predictably atomizes a fluid while eliminating dead volume upon discontinuance of the atomization process. Also, there is a need for an accurate, reliable and inexpensive flow controller. Similarly, there is a need for an integrated liquid delivery system wherein the system schematic can be consolidated to a single modular manifold device.

SUMMARY OF THE INVENTION

The present invention provides a vaporizer for delivering vapor streams such as high purity streams to a processing destination, such as a wafer processing chamber. The vaporizer includes a heated base or plate having one or more seamless slots formed in one of its faces for carrying a liquid which is vaporized by heat from the heated plate.

It is to be understood that both the foregoing general description of the invention and the following detailed description are exemplary, but are not restrictive, of the invention.

BRIEF DESCRIPTION OF THE DRAWING

The invention is best understood from the following detailed description when read in conjunction with the accompanying drawing. Accordingly, the present invention will now be described by way of non-limiting examples with references to the attached drawing, in which:

FIG. 5 is a sectional view of the manifolded fluid delivery system of FIGS. 1–4 taken along lines 3—3 of FIG. 3;

FIG. 6A is an enlarged view of the area designated by reference numeral 27 of FIG. 4.;

FIG. 6B is a sectional view taken along lines 6B of FIG. 6A;

FIG. 7 is a system schematic of the manifolded fluid delivery system of FIG. 2;

DETAILED DESCRIPTION OF THE INVENTION

Figure 1:
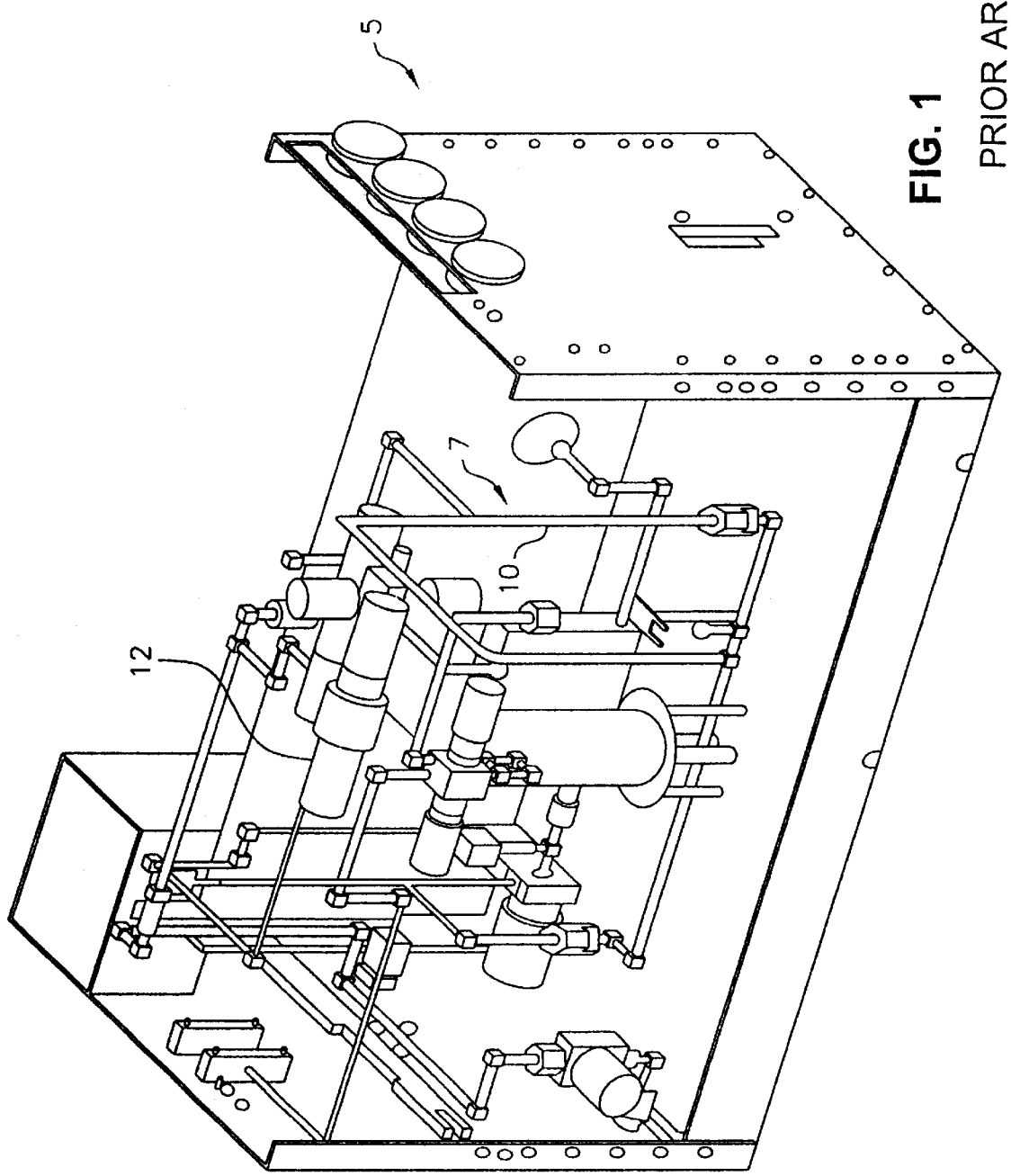
FIG. 1 is a perspective view of a prior art Fluid Delivery System.

Certain terminology used in the following description is for convenience only and is not limiting. The words "right," "left," "lower," and "upper" designate directions in the drawings to which reference is made. The words "inwardly" and "outwardly" refer to directions toward and away from, respectively, the geometric center of the liquid delivery system and manifold in accordance with the present invention and designated parts thereof. The terminology includes the words noted above as well as derivatives thereof and words of similar import. The term "seamless" is generally defined as designating a continuous slot surface connecting corresponding manifold apertures.

I. Single Sided Manifold

In accordance with the present invention, an integrated fluid delivery system (IFDS) is provided to dispense fluid streams. In an exemplary embodiment, the fluid streams are of high purity. The high purity fluid streams are typically utilized to manufacture semiconductor devices and typically process such fluids as silicon, boron and phosphorous precursors for delivery to a processing destination, such as a wafer processing chamber. Those skilled in the art will recognize, however, that the present invention is applicable to any number of fluid stream chemistry and/or manufacturing environments.

Referring now to the figures in detail, wherein like numerals indicate like elements throughout, there is shown in FIGS. 2–6B, a manifolded fluid delivery system 15 in accordance with the present invention. Fluid delivery system 15 includes a first modular manifold or "base" 16 for internally channeling the high purity fluid streams along seamless integrated slots 18 (shown best in FIG. 3) formed therein.

As shown in the exemplary embodiment, base 16 is a substantially planar, rectangular substrate or plate having first and second surfaces 20 and 22, respectively. Other shapes of base 16 can be used depending on the application. In an exemplary embodiment, base 16 is formed of stainless steel type 316L VAR (low carbon vacuum arc re-melt) selected for its high corrosion resistance. Other materials suitable for the fluids used in a particular application will be understood by those skilled in the art. The thickness of base 16 is suitable to the application and/or volume of chemicals to be processed therethrough.

One or more flow/processing devices 12 are mounted on respective interconnects 24. Interconnects 24 are mounted to base 16 via a mounting means, such as bolts (not shown), that are positioned through mounting holes 26. In an exemplary embodiment, mounting bolts are bolted to threaded interconnect apertures 28. In an exemplary embodiment, interconnects 24 are removable to allow for repair, maintenance, replacement or redesign of the IFDS and/or its component parts.

Figure 3:
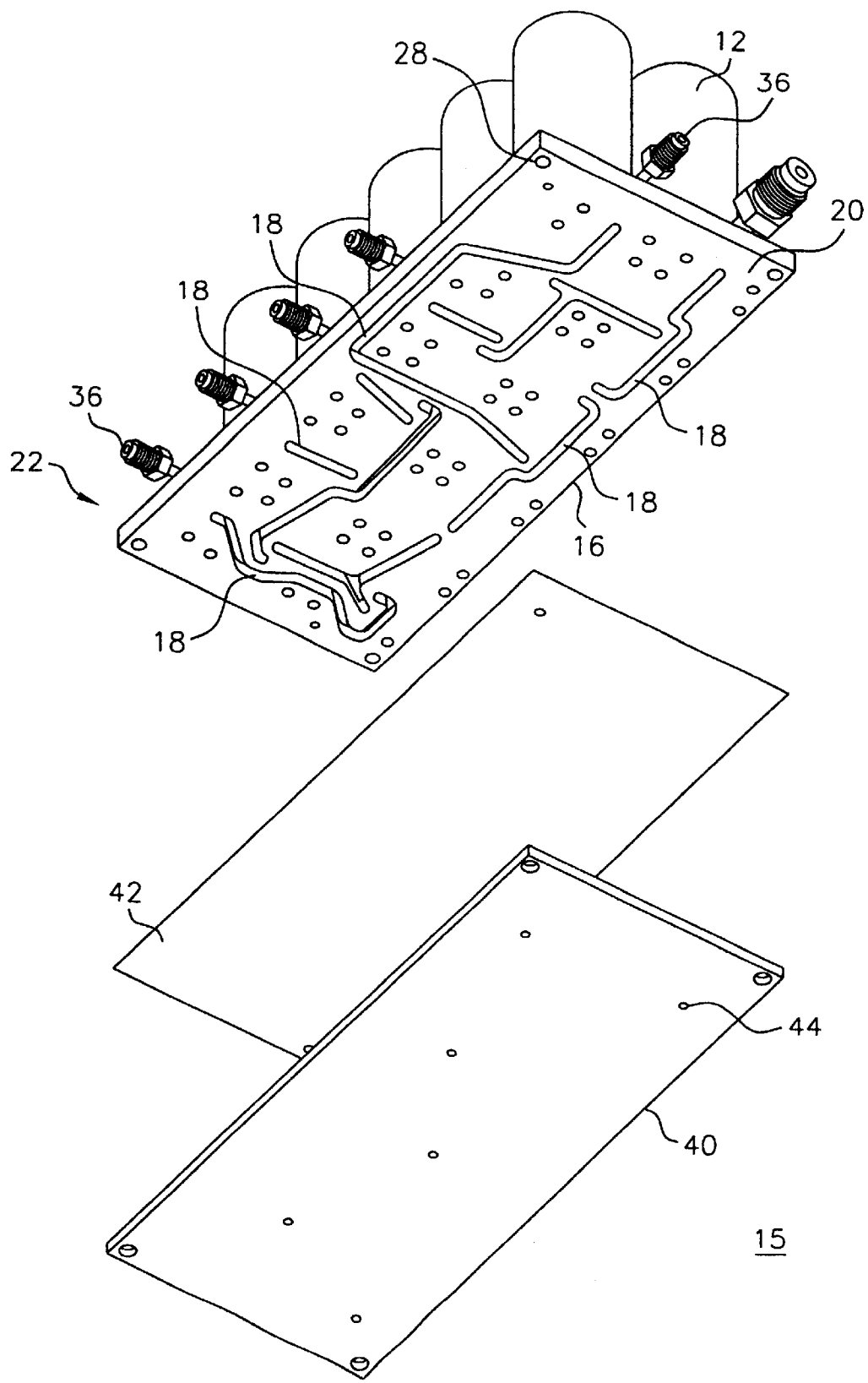
FIG. 3 is an exploded view of the manifold assembly of the fluid delivery system in accordance with FIG. 2.
Figure 4:
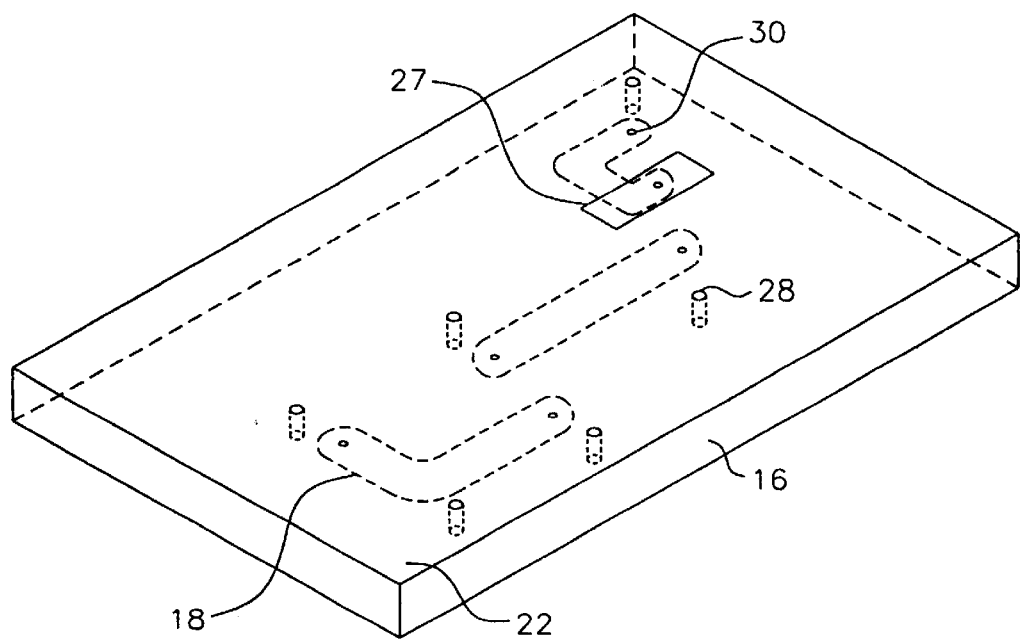
FIG. 4 is a perspective view of the manifold assembly of FIG. 3 showing seamless slots in phantom.

As shown in FIG. 3 and FIG. 4, base 16 includes at least one, and typically a plurality of seamless slots 18 (i.e., integrated seamless slots), interconnect apertures 28 (FIG. 4), and slot porting apertures 30 (FIG. 4) that are all formed on at least one of two major surfaces or faces thereof. In an exemplary embodiment, slot porting apertures 30 are metallic sealed. Other materials may be suitable for the seals, depending upon the application. Interconnect apertures 28 which may be threaded are arranged in a flow device footprint adapted for receiving an interconnect for mounting a corresponding flow device 12. One or both of first and second surfaces 20 and 22 can include seamless slots 18.

Seamless slots 18 are provided to consolidate a system schematic, such as shown in FIG. 7 onto surfaces 20 and/or 22 of base 16 for providing a modular manifold component. The depth of slots 18 is suitable to the application and/or volume of chemicals to be processed therethrough. In an exemplary embodiment, the system schematic is confined to a first surface 20 and seamless slots 18 are generally substantially elliptical in cross section. In another exemplary embodiment, seamless slots 18 are conical in cross section truncated with a tangential rounded radius as shown in FIG. 5.

Seamless slots 18 may be chemically etched and polished to avoid particulate entrapment. In an exemplary embodiment, seamless slots 18 are polished down to less than 16 rms for removing the grain structure of the metal surface of base 16. The metal surface of base 16 can be polished by extruding a polymer loaded with abrasives through base 16 at a high pressure through the use of polyurethane mill tooling. The unique shape of slots 18 is designed to complement the tooling for finishing purposes. Rectangular slots diminish the polishing ability of the mill tooling as rectangular slots have sharp corners that are difficult to access. Alternatively, seamless slots 18 may be formed by machining or other methods known in the art.

As shown in FIG. 4, seamless slots 18 include, along surfaces thereof, first slot porting apertures 30 extending from a surface of seamless slots 18 through to another base surface (22 in FIG. 4), for channeling high purity fluid streams therethrough.

As shown best in FIGS. 5, 6A, and 6B slot porting apertures 30 are finished with a detail 32 or "counterbore" to receive a corrosion-resistant seal. A corrosion-resistant seal such as a z-seal or c-seal, is used (in an exemplary embodiment, but not shown) upon connection of a corresponding flow device 12 or pneumatic control line. Corrosion-resistant seals, as used in an exemplary embodiment, require a higher tolerance finish (i.e., less than 16 rms) than that used for elastomeric fittings. The specifics of machining the appropriate finish for receiving the selected commercially available seal is understood by those skilled in the art. In some applications, it may be possible to use non-metallic, corrosion-resistant seals.

Figure 2:
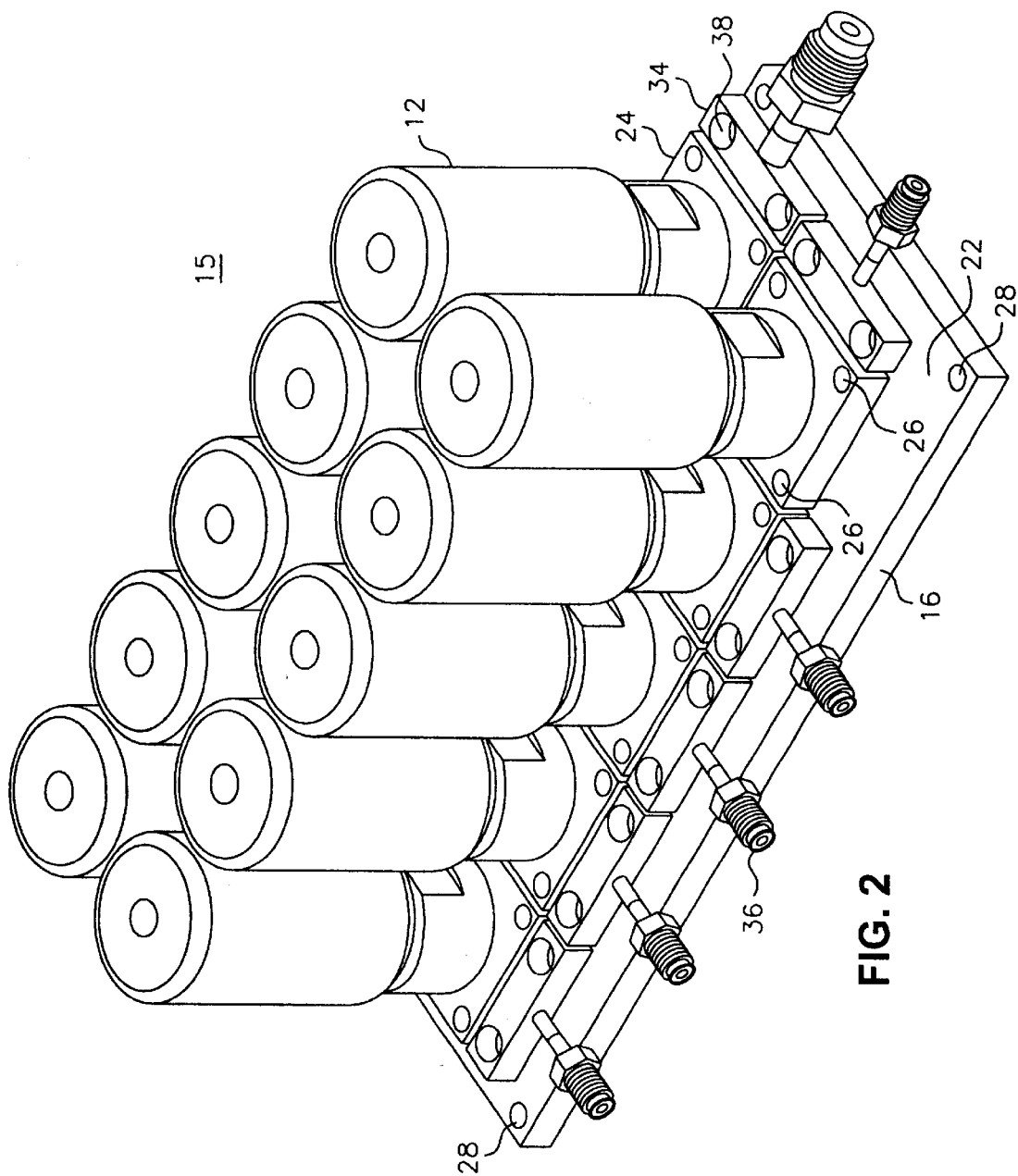
FIG. 2 is a perspective view of the manifolded fluid delivery system in accordance with one embodiment of the present invention.

As shown in FIGS. 2 and 3, interconnects 24 are provided between both slot porting apertures 30 and a desired flow device 12. Interconnects 34 which may be attached to a low leakage fitting 36 (such as a VCR fitting manufactured by Swagelok Company of Solon, Ohio) as a single piece, are also provided between porting apertures 30 and desired flow device 12. Interconnect 34 is mounted to base 16 via mounting apertures 38 (bolts not shown). Interconnects 24 are typically commercially available fittings such as those manufactured by Swagelok Company of Solon, Ohio having a detail corresponding to that of apertures 30 for seating the corrosion-resistant seal. Base 16 receives interconnects 24 by way of bolting through interconnect apertures 28. In an exemplary embodiment, a commercially available corrosion-resistant seal (not shown) is constructed of nickel and is interposed between apertures 30 and interconnect 24 for forming a compression fitting. The material of the seal should be a softer metal with respect to base 16 so that upon seating interconnect 24 on base 16 the seal is compressed and deforms to seal the connection upon bolting or other securing means.

A face plate 40 is shown in FIG. 3, having a first and second surface. Face plate 40 is sealed or joined to first surface 20 of base 16 for enclosing seamless slots 18. Face plate 40 can be sealed to either first or second surface 20 or 22 of base 16 depending upon the application. A brazing medium 42 is disposed between base 16 and faceplate 40 and is utilized to seal face plate 40 to a desired surface of base 16 by brazing. In an exemplary embodiment, a nickel brazing medium 42 is used for the brazing process and base 16 is secured to face plate 40 by vacuum brazing. In this way, face plate 40 is joined with base 16, so that a first surface of face plate 40 abuts a surface (such as first surface 20) of base 16.

Face plate 40 may additionally include corrosion-resistant sealed plate porting apertures 44 positioned to overlay slots 18 of base 16. In such an embodiment seamless slots 18 can be accessed by a processing destination such as a wafer processing chamber through or from flow device 12. Plate porting apertures 44 are likewise finished with a detail 32 (as shown in slot porting apertures 30 in FIGS. 6A and 6B) or "counterbore" to receive a corrosion-resistant seal (such as a z-seal or c-seal, not shown) upon connection of a corresponding flow device or pneumatic control line to introduce the fluid streams to base 16. The present invention can be practiced without employing corrosion-resistant sealed plate porting apertures 44. Moreover, the thickness of face plate 40 is a matter of design choice for maintaining non-deformity when securing instrumentation to any resident plate porting apertures 44.

In an exemplary operation, base 16 receives each of the high purity fluid streams at a corresponding corrosion-resistant sealed slot porting aperture 30 for transporting a fluid along seamless slots 18. Corrosion-resistant sealed porting apertures 30 receive, upon connection of a corresponding flow device or pneumatic control line or the like, fluid streams for transport of one or more fluids through seamless slots 18 of base 16.

Slot porting apertures 30 are in fluidic communication with additional slot porting apertures located along seamless slots 18, as well as plate porting apertures 44 for channeling high purity fluid streams between slots in different bases. In embodiments where face plate 40 may not employ plate porting apertures 44, fluid would flow along seamless slots 18 between corresponding slot porting apertures 30. Once mated to an interconnect fitting 24, fluid device 12 is in fluidic communication with a corresponding one of the high purity liquid streams of base 16.

As shown in FIG. 7, an entire system schematic can be consolidated to base 16 with the corresponding valving and flow devices interconnected thereto for eliminating the need for the bulky conduit assemblies of the prior art. In this way, base 16 provides a modular system schematic for dispensing the fluid streams from integrated fluid delivery system 15 to processing destination such as a wafer processing chamber or other device requiring fluid streams.

II. Multisided Manifold

Figure 8:
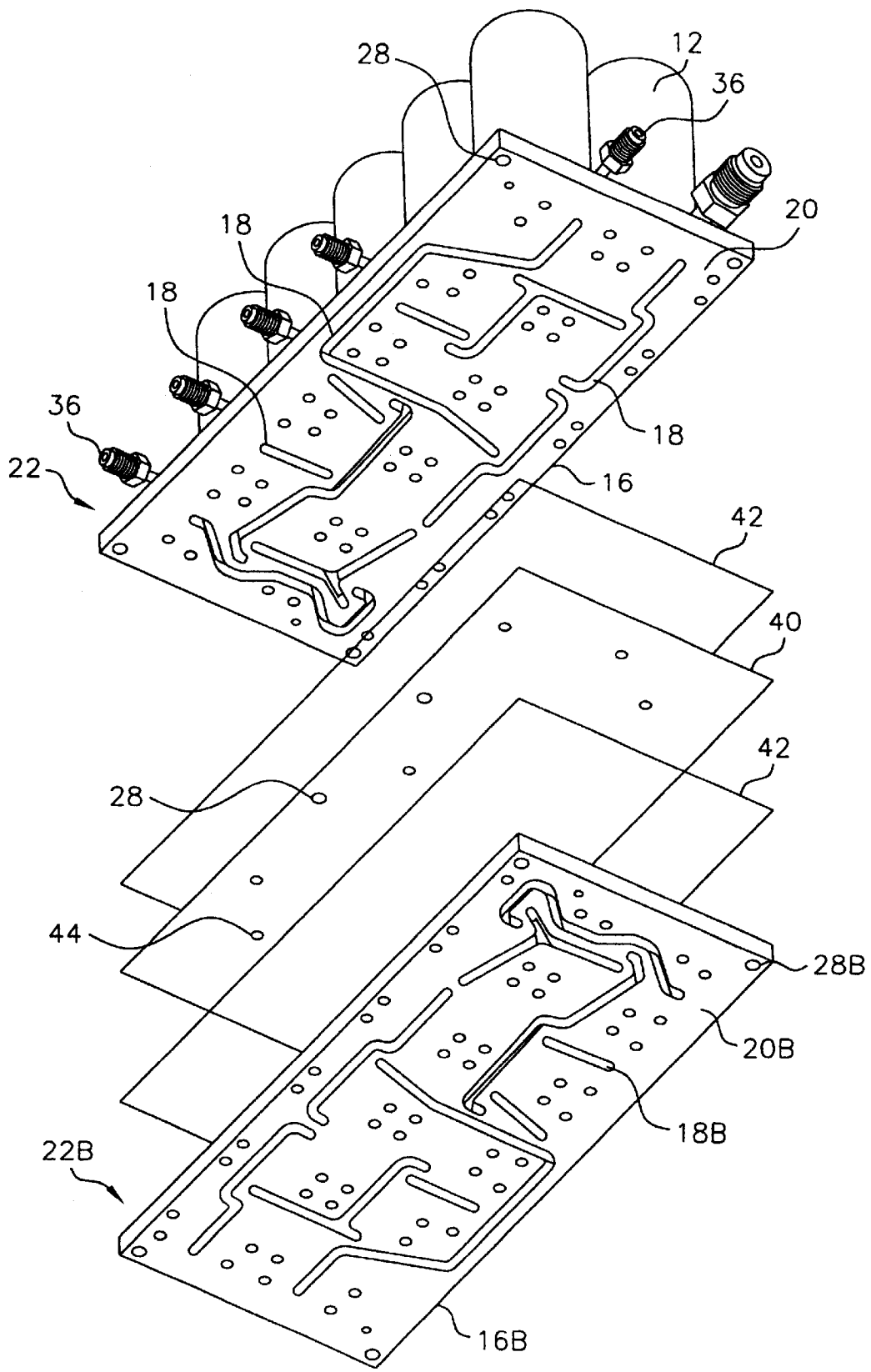
FIG. 8 is a bottom exploded view of the manifold assembly of a multilayered manifolded fluid delivery system in accordance with one embodiment of the present invention.

In a further embodiment, a second base 16B is provided as shown in FIG. 8 having similar details as base 16. The features of second base 16B are identified by a reference numeral followed by the letter "B". Second base 16B also has a first and second surface 20B and 22B respectively. Second base 16B also includes integrated seamless slots 18B formed thereon for channeling a fluid stream therethrough. Second seamless slots 18B include, along surfaces thereof, second slot porting apertures (not shown) which are corrosion-resistant sealed porting apertures extending from the surfaces of the second slots 18B through the second base 16B. Second base 16B is sealed to an available side of face plate 40 in the same manner as that of the embodiment shown in FIG. 3. Plate porting apertures 44 overlay the slot porting apertures of the integrated slots 18B and the faceplate is interposed between first base 16 and second base 16B so that interconnect apertures 28 and 28B are in alignment.

In an exemplary embodiment, slot porting apertures in second base plate 16B are in fluidic communication with slot porting apertures 30 which are also through first slots 18 and second slots 18B for channeling fluid streams therebetween.

A second face plate (not shown) is connected to first surface 20B of base 16B for sealing slots 18B. It will be understood by those skilled in the art that any number of base sections 16 can be layered in this manner depending upon the particular application and that the invention described herein is not limited to the illustration but used above for explanatory purposes only.

III. Liquid Mass Flow Controller

Figure 9:
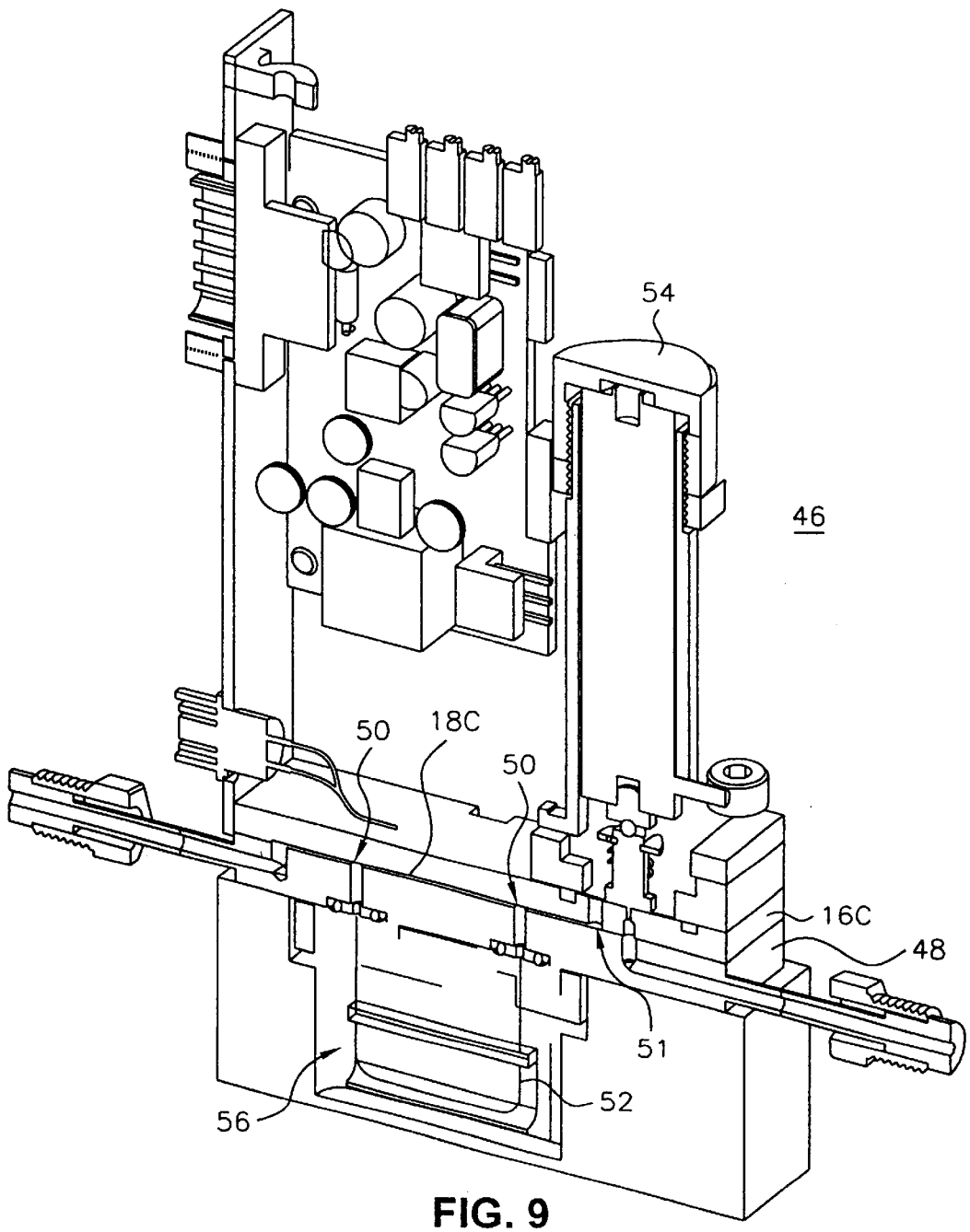
FIG. 9 is a longitudinal sectional view of a flow controller for use in an integrated fluid delivery system according to one embodiment of the present invention.
Figure 10A:
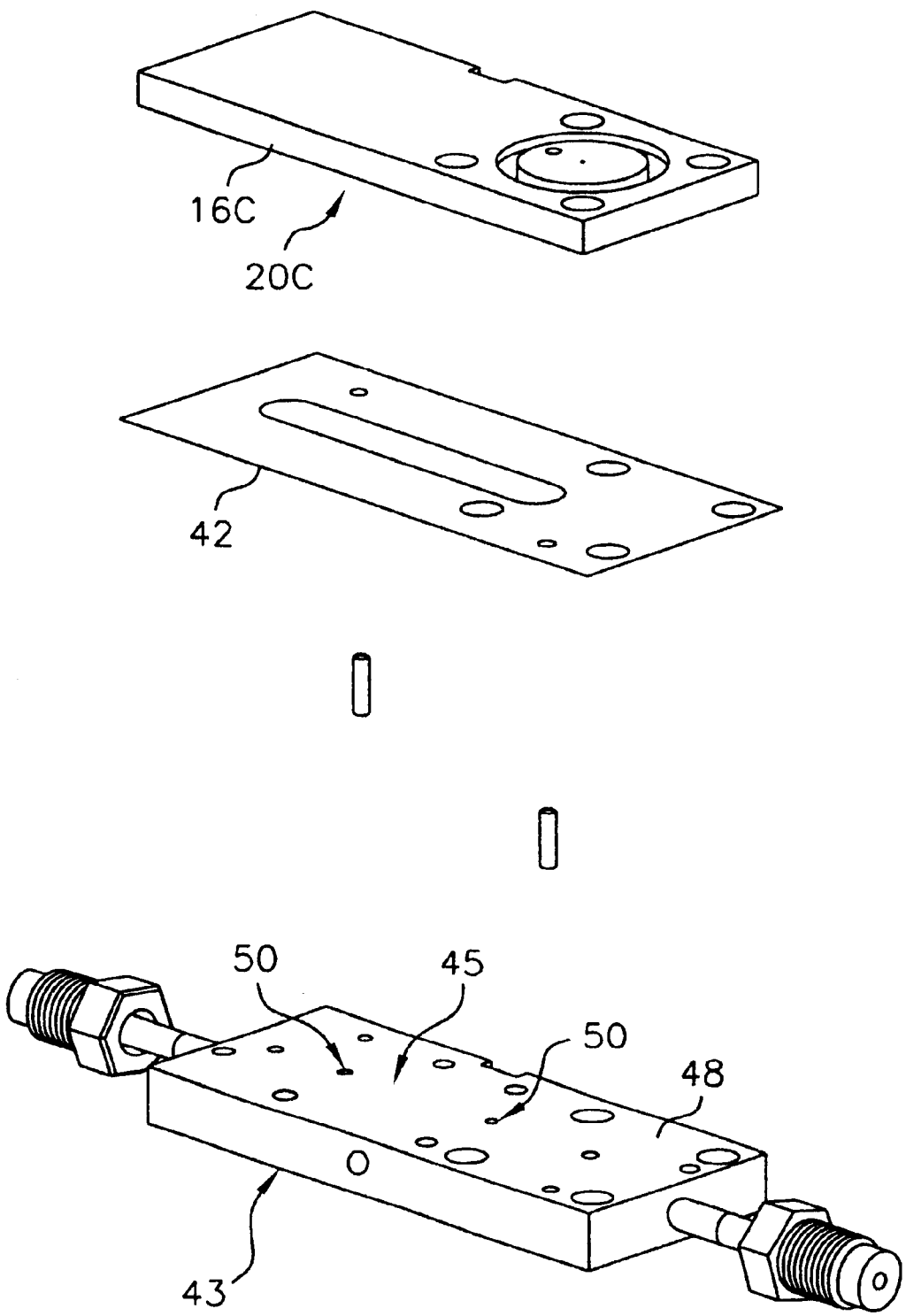
FIG. 10A is an exploded perspective view of a subassembly of the flow controller of FIG. 9.
Figure 10B:
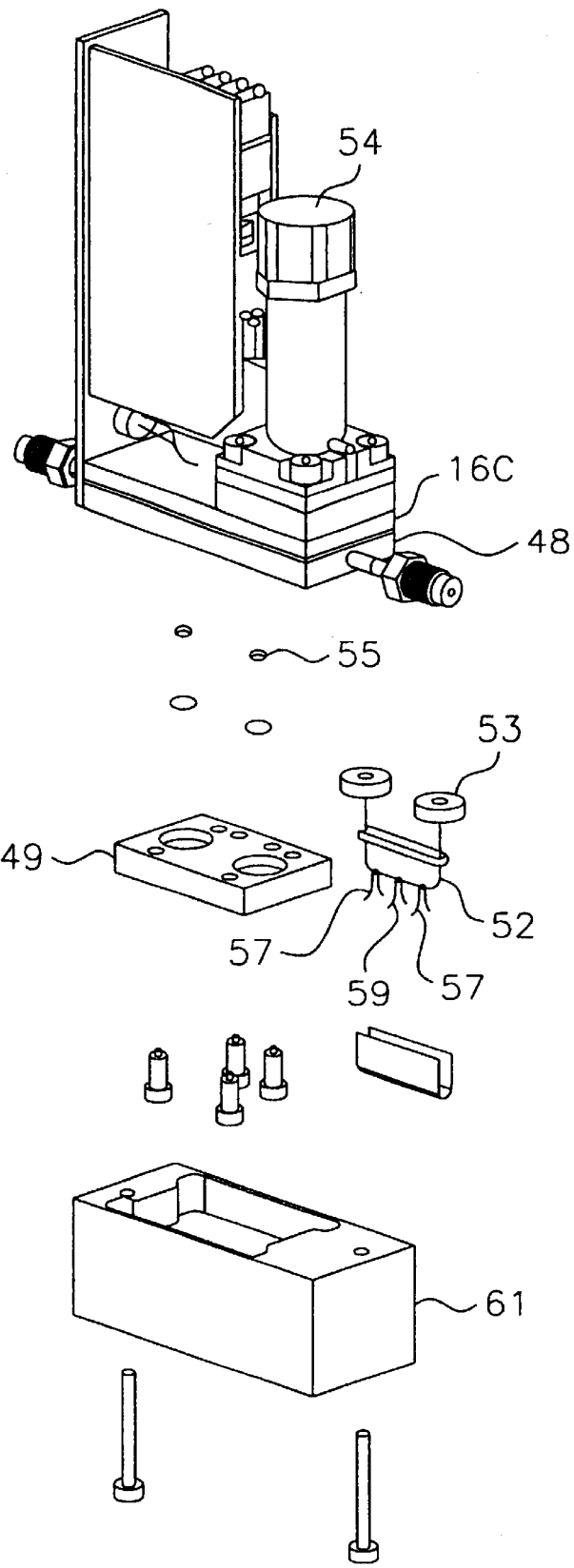
FIG. 10B is an exploded perspective view of a sensor channel for the flow controller of FIG. 9.
Figure 11:
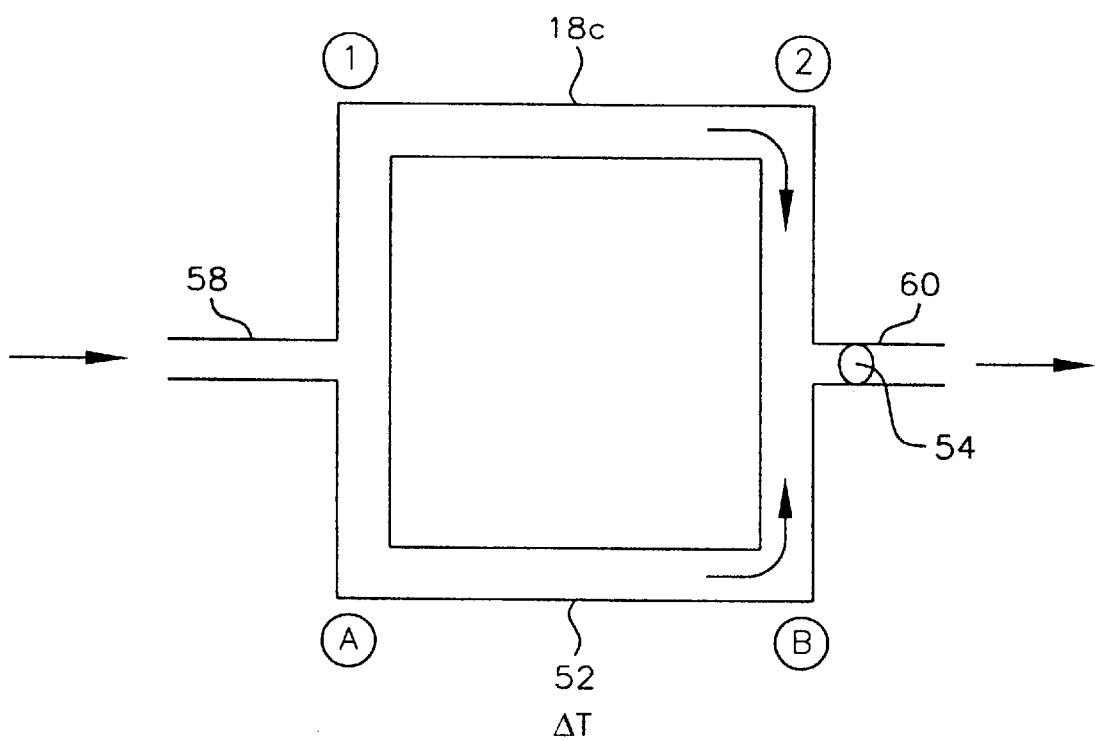
FIG. 11 is a system schematic of the embodiment of the present invention shown in FIG. 9.

Referring now to FIGS. 9–11, an exemplary embodiment of the present invention is shown in which base 16C is interconnected with a flow processing device to form a flow controller 46.

As shown in FIG. 9, a liquid flow controller assembly 46 employs a base 16C and an interconnect plate 48. In an exemplary embodiment, base 16C includes a seamless slot 18C (best shown in FIG. 9) between base 16C and interconnect plate 48. As above, with respect to base 16, base 16C and interconnect plate 48 are joined together by a brazing medium 42 using a vacuum brazing process. In an exemplary embodiment, base 16C can be vacuum brazed, at slot face 20C directly to second face 45 (shown in FIG. 10A) of interconnect plate 48 of liquid flow controller assembly 46. Seamless slots 18C may be formed by machining, etching, or other processes known in the art. Base may be a plate (or slot plate) having two opposing surfaces or faces, one of these faces being slot face 20C. In this way, slot face 20C and second face 45 abut so that seamless slot 18C is sealed by the abutment.

Porting apertures 50 are formed within interconnect plate 48 positioned to align with seamless slot 18C and extending to the first face 43 of interconnect plate 48 to allow the flow of liquid into and out of, a formed sensor channel 52 (discussed below). In an exemplary embodiment, porting apertures 50 are corrosion-resistant sealed similar to those corrosion-resistant sealed apertures previously discussed herein. Porting apertures 50 may provide for a portion of the liquid stream to flow into and through the sensor channel of the flow controller. As such, porting apertures 50 may be finished with a detail 32 or "counterbore." Detail 32 is provided for receiving a corrosion-resistant seal (such as a z-seal or c-seal not shown) upon connection of a corresponding flow device or pneumatic control line to introduce or outlet, fluid streams between base 16C.

Flow controller 46 includes a sensor channel 52 (best shown in FIG. 9) for providing a pathway for a fluid stream of base 16C. Sensor channel 52 in sensor area 56 carries a portion of the fluid stream transported into base 16C, with the remainder to be carried along seamless slot 18C. Sensor channel 52 is provided for measuring a change in temperature or temperature gradient ($\Delta T$) of the portion of fluid flowing therein across points A and B in FIG. 11.

Sensor channel 52, as shown in FIGS. 9 and 10B, comprises a tube section in fluid communication with seamless slot 18C through porting apertures 50 in interconnect plate 48. In a preferred embodiment of the present invention, sensor channel 52 extend downwardly from seamless slot 18C through a sensor plate 49 and into a sensor area 56 of a sensor housing 61, such that sensor channel 52 is at a lower elevation than seamless slot 18C. Two temperature sensors 57 are mounted on sensor channel 52 with a heater 59 is mounted on the sensor channel between the temperature sensors. In an exemplary embodiment, the sensors and heater comprise wire windings wrapped about the tubing. The heater transfers heat to the fluid to raise the fluid temperature up to 30 degrees Celsius. In an exemplary embodiment, however, the fluid temperature is raised about 5 degrees Celsius to avoid degradation of certain precursors that may be used with flow controller 46. In an exemplary embodiment, the sensor channel 52 extends downwardly to reduce blockage of the sensor channel by gas bubbles carried in the fluid stream.

In an exemplary embodiment of the invention, buttons 53 are welded to the ends of sensor channel 52. Buttons 53 are positioned in counterbores in sensor plate 49, and corrosion-resistant seals are compressed between buttons 53 and interconnect plate 48. Spacers 55 may be positioned inside the corrosion-resistant seals. Then sensor plate 49 is fastened to interconnect plate 48, such as with bolts, and sensor housing 61 is fastened to sensor plate 49.

Slot porting aperture 51 is formed in seamless slot 18C, extending through base 16C and providing fluid communication between seamless slot 18C and flow control valve 54. Flow control valve 54 is operably connected to temperature sensors 57. The temperature difference ($\Delta T$) infers the flow through seamless slot 18C, and this temperature difference is used to generate an output signal voltage. The flow controller 46 can be used to adjust the mass flow through the flow controller 46 by adjusting the opening of flow control valve 54. Control electronics adjust the opening of flow control valve 54 until the output signal voltage is equal to a predetermined set-point in the control electronics corresponding to a desired mass flow rate. In an exemplary embodiment, the set-point is determined by a variable resistor, such as a potentiometer. Flow control valve 54 may be a suitable valve for the particular application that can be electronically adjusted to provide a variable flow rate. In an exemplary embodiment, flow control valve 54 is a piezotranslator, in which stacked ceramic disks press against a flexible metal diaphragm to open or close the diaphragm against apertures in a fluid pathway. The pressure applied by the ceramic disks is proportional to a voltage applied to them. The flow rate is determined by the gap between the diaphragm and the flat surface having the apertures in it (up to about 0.002 inches in an exemplary flow control valve).

Referring more particularly to FIG. 11, a system schematic of base 16C and flow controller 46 is shown. Inlet 58 into base 16C is a high pressure inlet which branches into two separate pathways. The first pathway is seamless slot 18C for providing a bypass pathway or channel. The second pathway is sensor channel 52. Flow valve 54 is in fluidic communication with seamless slot 18C for receiving the portion of fluid flowing through sensor channel 52 (which is proportional to the flow through seamless slot 18C) and the portion of fluid flowing through seamless slot 18C. Seamless slot 18C provides a pressure drop from points 1 to 2 in FIG. 11. Sensor channel 52 and seamless slot 18C are in fluidic communication with a low pressure outlet 60, through control valve 54.

The change in temperature across points A and B of sensor channel 52 corresponds to an actual fluid flow through the flow controller 46 and has a very low response time on the order of 3 seconds or less. This is an improvement over the simple sampling of a single fluid stream as such an arrangement yields very slow response time (e.g., 20 seconds). This arrangement provides a fast and accurate reading of fluid flow. This mass flow controller can be a modular component for use in an IFDS.

IV. Atomizer

In accordance with another exemplary embodiment of the present invention, an atomizer for combining separate gas and liquid streams is provided. This atomizer can be a modular component for use in an IFDS. A mixing point is defined by the junction of a liquid inlet to a mixing slot. A gas stream inlet is in fluidic communication with a side of the mixing slot. A mixture outlet defines the remaining side of the mixing slot. A gas stream flowing into the mixing point is accelerated to a high velocity, reducing pressure for drawing the liquid into the gas stream by venturi effect.

Figure 12:
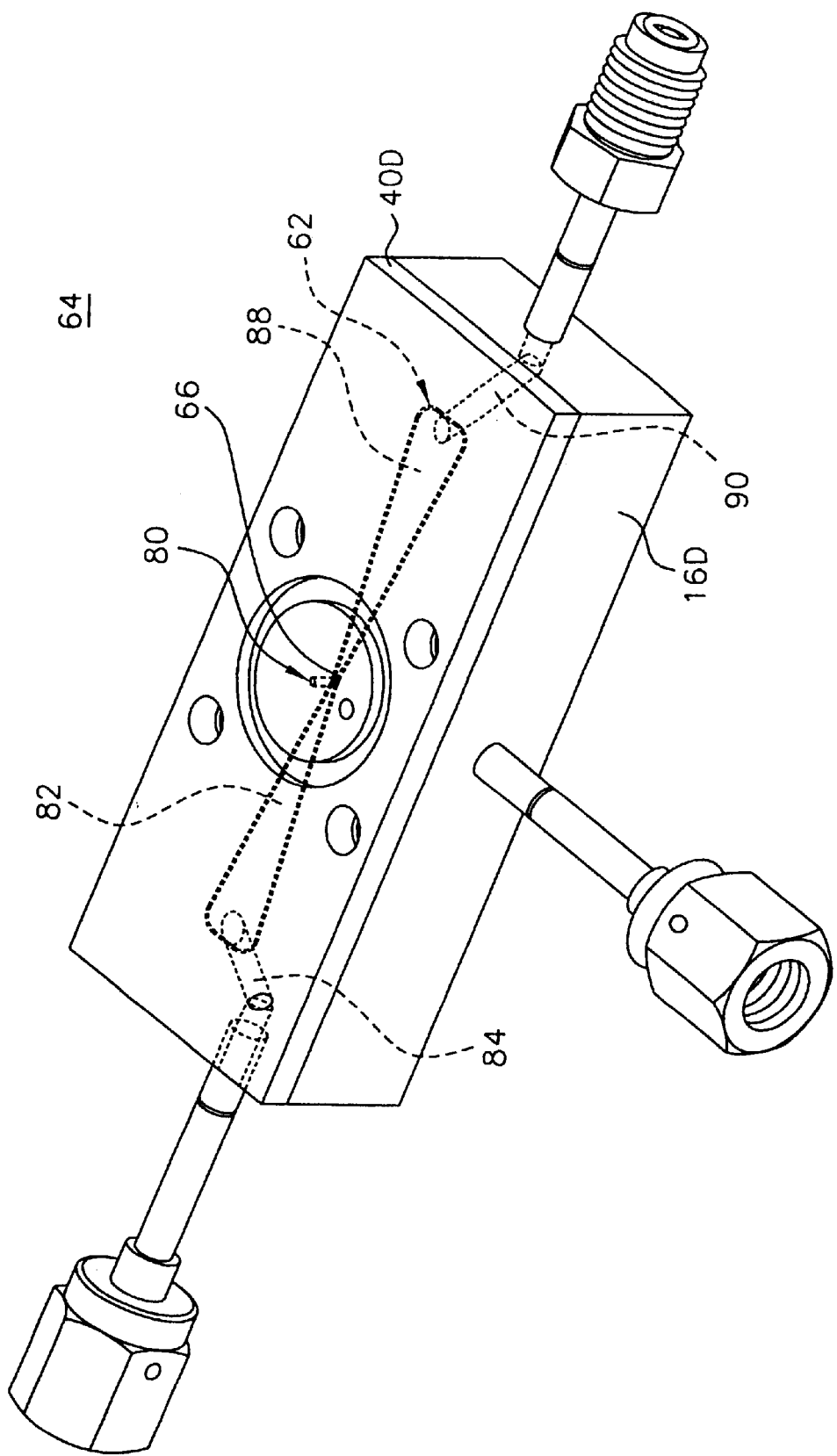
FIG. 12 is a top view of a mixing slot of an atomizer in accordance with an embodiment of the present invention.

There is shown in FIG. 12 a mixing slot 62 of an atomizer 64 for combining separate gas and liquid streams. Mixing slot 62 has a mixing point 66 for atomizing a liquid stream into a gas stream. A stream of the high purity mixture of fluid and gas are utilized, for example, to deposit high-purity, metal oxide films on a substrate in processes such as semiconductor manufacturing. Moreover, the liquid and gas mixtures may also be utilized for spray coating, spin coating and sol-gel deposition of materials. Those skilled in the art will recognize, however, that the present invention is applicable to any number of fluid/gas stream chemistry and/or manufacturing environments.

Atomizer 64 includes a base member 16D having a mixing slot 62 formed in a face thereof for producing a venturi effect at a mixing point 66. In the exemplary embodiment shown, base 16D is a substantially planar, rectangular substrate formed of type 316 stainless steel (low carbon vacuum arc re-milled) LVAR selected for its high corrosion resistance. Other shapes of base 16D can be used depending on the application, and other materials suitable for the fluids/gases used in a particular application may be used as will be understood by those skilled in the art. The thickness of base 16D is suitable to the application and/or volume of chemicals to be processed therethrough. An exemplary base member structure is shown in FIG. 12 and described below. Mixing slot 62 may be formed by machining, etching, or other processes known in the art.

Mixing slot 62 of base member 16D has a gas input side 82 and a mixture side 88. In an exemplary embodiment, mixing slot 62 is generally hourglass shaped. Gas input side 82 and mixture side 88 are each substantially triangular in shape and are in fluid communication through a throat joining their respective apices. A mixing point 66 is located at the throat of the hourglass shape. The venturi effect is caused by the narrowing of the gas input side 82 and mixture side 88 of the hourglass shape, which increases the velocity of the gas lowering the pressure and drawing liquid into the gas stream. The particular fluid dynamics of the venturi effect will be understood by those skilled in the art.

A liquid inlet 80 is in fluidic communication with mixing point 66 of mixing slot 62. Mixing point 66 is defined by the junction of liquid inlet 80 and mixing slot 62. A gas stream inlet 84 is in fluidic communication with gas input side 82 of mixing slot 62. A valve (not shown) proximate to mixing point 66 may be provided for controlling the introduction of a liquid stream through liquid inlet 80 and eliminating dead volume upon discontinuance of the process as it controls the entry of the liquid stream at mixing point 66. A mixture outlet 90 is in fluidic communication with mixture output side 88 of mixing slot 62. A face plate 40D abuts base member 16D sealing mixing slot 62.

The atomizer described herein may be provided as a modular component for use in an IFDS.

V. Atomizer/Vaporizer

Figure 13:
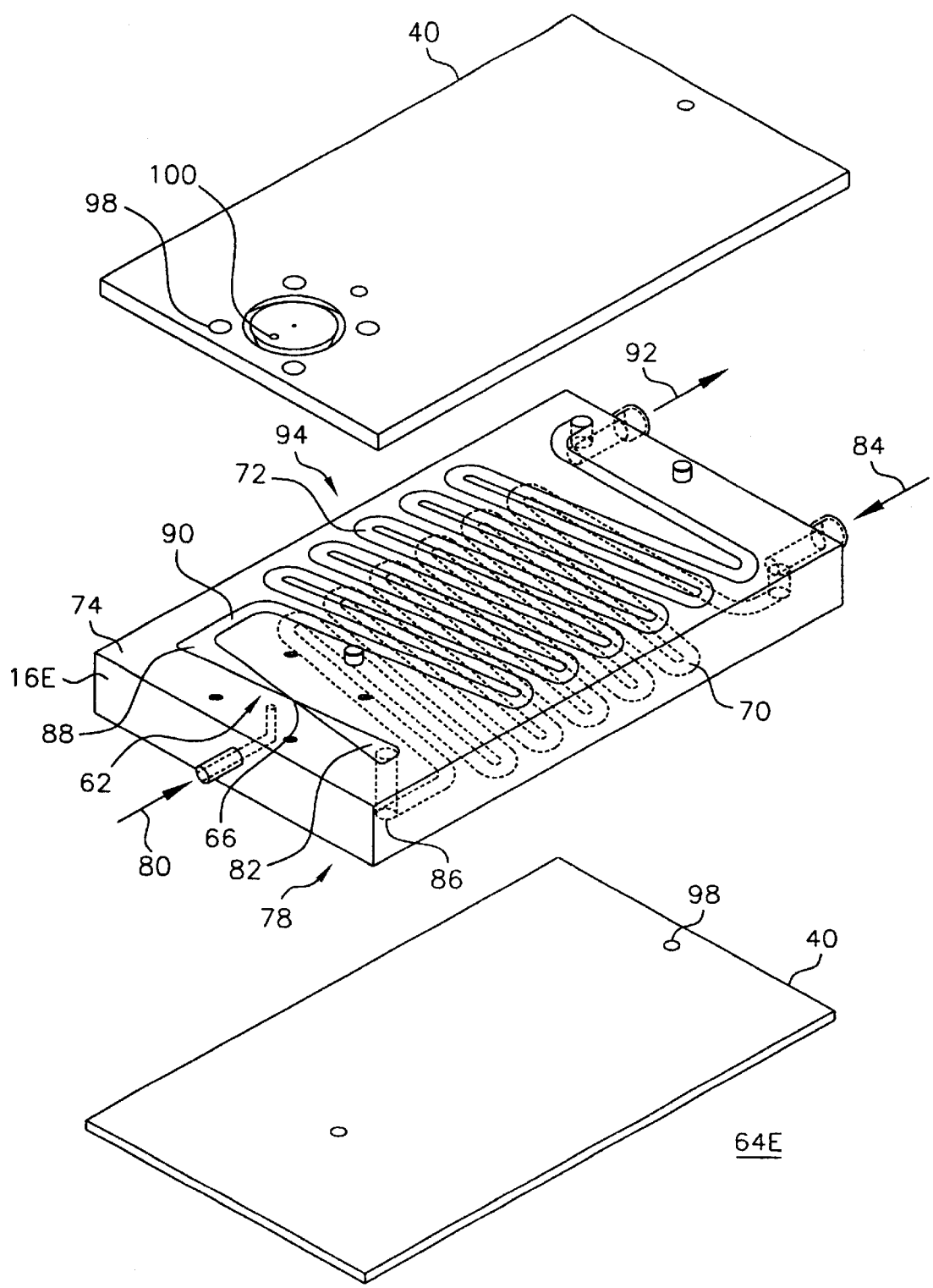
FIG. 13 is an exploded view of an atomizer/vaporizer in accordance with an exemplary embodiment of the present invention.

In one exemplary embodiment, as shown in FIG. 13, a mixing slot for atomizing a liquid into a gas stream, and a mixture heating slot for vaporizing the atomized liquid in the mixture are combined to form a vaporizer 64E. A base member 16E has a mixing slot 62, as described above, formed in one of its faces for producing a venturi effect at a mixing point 66. A gas slot 70 and a mixture heating slot 72 are formed in base member 16E in fluid communication with the gas input side 82 and mixture side 88, respectively, of mixing slot 62. Base member 16E internally channels gas and fluid streams along seamless slots 70 and 72. In the exemplary embodiment shown, base 16E is a substantially planar, rectangular substrate having first and second surfaces 74 and 78, respectively. Other shapes of base 16E can be used depending on the application. In this exemplary embodiment, base 16E is formed of stainless steel type 316 LVAR (low carbon vacuum arc re-milled) selected for its high corrosion resistance. Other materials suitable for the fluids/gases used in a particular application will be understood by those skilled in the art. The thickness of base 16E is suitable to the application and/or volume of chemicals to be processed therethrough.

In an exemplary embodiment, gas slot 70 is provided having a gas inlet side 84 and a gas outlet side 86. Gas outlet side 86 of gas slot 70 is connected to gas input side 82 of mixing slot 62. In an exemplary embodiment, as shown in FIG. 13, gas slot 70 is a serpentine pathway for heating the gas stream to either a predetermined or adjustable temperature. The degree of heating is dependent upon the length of the pathway and type of gas, as well as other factors (e.g., gas velocity and temperature difference between gas and base). The gas stream flowing into a mixing slot may be heated to reduce the heat required to be added to the mixture stream for vaporization.

FIG. 13 shows mixture heating slot 72 in fluidic communication with mixture side 88 of mixing slot 62. Mixture heating slot 72 has a mixture inlet 90 and a mixture outlet 92. Mixture heating slot 72 is connected to mixture side 88 of mixing slot 62. In operation a gas stream flows through gas slot 70, into mixing slot 62, and then to mixing point 66. The velocity of the gas stream is increased in velocity by the narrowing of gas input side 82 lowering the pressure at mixing slot 62 and generating a venturi effect. In this way, portions of the liquid stream are drawn into the gas stream to provide an atomized mixture of gas and liquid streams to mixture heating slot 72. The mixture stream is heated in mixture heating slot 72, vaporizing the atomized liquid in the mixture to form a vapor mixture which exits base 16E via outlet 92.

As shown in FIG. 13, gas slot 70 and mixture heating slot 72 are sealed within base 16E by a pair of faceplates 40. A brazing medium (not shown) may be utilized to seal face plates 40 to surfaces 74 and 78 of base 16E by brazing. In an exemplary embodiment, the brazing process is similar to the brazing process described herein. In an exemplary embodiment, a nickel medium is used for the brazing process and base 16E is secured to face plates 40 by vacuum brazing. Alternatively, faceplates 40 may be sealed to the base 16E by way of interconnect apertures 98 provided to receive bolts (not shown). Additionally face plates 40 may include porting apertures 100 for importing and exporting fluid and/or gas streams directly to base 16E, such as from a flow control valve (not shown). Porting apertures 100 are sealed with a corrosion-resistant seal in an exemplary embodiment. While vaporizer 64E is shown having a serpentine layout, it is recognized by those skilled in the art that gas slot 70 and mixture heating slot 72 may be any number of layouts for heating the gas and mixture, or be essentially straight where necessary.

VI. Vaporizer

In an exemplary embodiment of a vaporizer, a heat exchanger is provided in fluidic communication with a mixture stream, such as at mixture side 88 of mixing slot 62 of an atomizer as described above. The heat exchanger can encompass a single continuous pathway, such as mixture heating slot 72, as shown in FIG. 13. The heat exchanger may be in fluid communication with the outlet of an atomizer as described herein. The heat exchanger provides heat to an atomized liquid stream vaporizing the atomized liquid. Atomizing the liquid in a mixed stream of gas and liquid prior to vaporization lowers the temperature of vaporization, which may reduce degradation of certain liquid precursors.

The heat exchanger may be a serpentine pathway, as shown in FIG. 13, for heating the atomized mixture to a predetermined temperature for vaporization. The degree of heating is dependent, in part, upon the length of the pathway and atomized chemistry. Other heat exchanger configuration, however, are possible and are within the scope of the invention.

Figure 14:
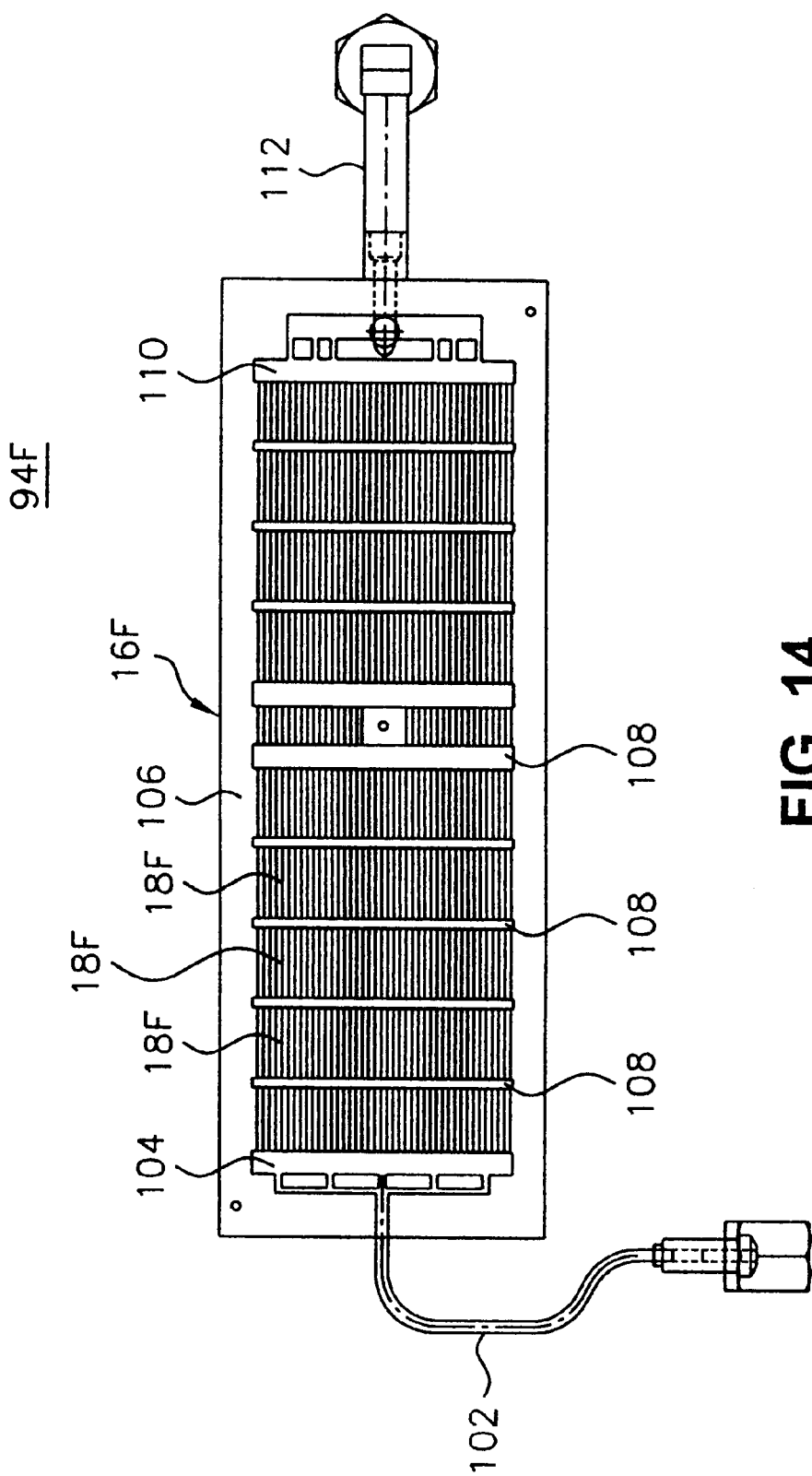
FIG. 14 is a heat exchanger for use in an integrated fluid delivery system in accordance with an embodiment of the present invention.

In another exemplary embodiment of the present invention, an alternate heat exchanger 94F, is shown in FIG. 14. Heat exchanger 94F may be used to vaporize atomized liquid in a mixture stream produced by an atomizer 64 or for vaporizing a liquid supplied to the inlet of heat exchanger 94F which is neither atomized nor mixed with a gas stream. Heat exchanger 94F includes a base 16F with an inlet 102 in fluid communication with a mixture outlet of an atomizer or an unatomized and unmixed liquid stream. A distribution slot 104 formed in a slot face 106 of base 16F is in fluid communication with inlet 102 and a plurality of seamless slots 18F formed in slot face 106. A plurality of cross-slots 108 are formed in face 106 intersecting the plurality of seamless slots 18F. The cross-sectional area of the seamless slots is small enough to prevent surface tension from beading the liquid, which would reduce contact with the heated surface and reduce efficient heat transfer. Liquid is turned into vapor by the application of heat. If liquid is heated in a single slot or channel, bubbles of vapor can form that will expand rapidly and push slugs of liquid to the outlet, causing spitting. The cross-slots allow vapor bubbles to find a path to the outlet without pushing a slug of liquid to the outlet. The cross-sectional area of the cross-slots 108 may be larger than the cross-sectional area of the seamless slots 18F to capture slugs of liquid and further reduce spitting.

Although illustrated and described above with reference to certain specific embodiments, the present invention is nevertheless not intended to be limited to the details shown. Rather, various modifications may be made in the details within the scope and range of equivalents of the claims and without departing from the spirit of the invention.

What is claimed is:

1. A vaporizer for combining a liquid with a gas stream and vaporizing the liquid, comprising:
   a base member having a face thereon;
   a mixing slot formed in the face of the base member for atomizing the liquid and combining it with a gas stream using a venturi effect; and
   a heat exchanger in fluid communication with the mixing slot for vaporizing the atomized liquid.

2. The vaporizer of claim 1 wherein the mixing slot comprises:
   a gas inlet side, a throat, and a mixture outlet side, the throat in fluid communication with the gas inlet side and the mixture outlet side, the gas inlet side having a smoothly decreasing cross-sectional area and the mixture outlet side having a smoothly increasing cross-sectional area, the throat having a mixing point; and
   the vaporizer further comprises a liquid inlet in fluid communication with the throat of the mixing slot for introducing liquid to the mixing slot at the mixing point.

3. The vaporizer of claim 2 further comprising a sealing member, and the mixing slot is sealed by the sealing member abutting one of the faces of the base member having the mixing slot formed therein.

4. The vaporizer of claim 2 wherein the heat exchanger comprises a slot formed in the base member.

5. The vaporizer of claim 2, further comprising a second base member and the heat exchanger comprises a slot formed in a second base member.

6. The vaporizer of claim 2 further comprising a valve proximate the mixing point for controlling the introduction of the liquid into the gas stream.

7. A vaporizer for combining a liquid with a gas stream and vaporizing the liquid, comprising:
   a mixing slot for atomizing the liquid and combining it with the gas stream using a venturi effect; and
   a heat exchanger in fluid communication with the mixing slot for vaporizing the atomized liquid, the heat exchanger comprising:
   a heated plate having a first and a second face, the first face comprising a plurality of first and second slots, the plurality of first slots being spaced, essentially parallel to one another and the plurality of second slots, interconnecting adjacent ones of the first slots;
   a sealing member abutting the first fate and sealing the plurality of first and second slots; and
   inlet and outlet apertures in fluid communication with two of the plurality of second slots.

8. The vaporizer of claim 7 wherein the first slots have a first cross-sectional area and the second slots have a second cross-sectional area not less than the first cross-sectional area.

9. A vaporizer for combining separate gas and liquid streams, comprising:
   a base member having a mixing slot formed therein for producing a venturi effect at a mixing point, the mixing slot having a gas input side and a mixture side;
   a gas slot in fluidic communication with the mixing slot, the gas slot having a gas inlet side and a gas outlet side, the gas outlet side of the gas slot being connected to the gas inlet side of the mixing slot;
   a liquid inlet in fluidic communication at a junction with the mixing slot, a mixing point defined by the junction of the liquid inlet to the mixing slot; and
   a heat exchanger in fluidic communication with the mixture side of the mixing slot, the heat exchanger having a mixture outlet, the gas stream flowing through the gas slot into the mixing point to be combined by venturi effect with the fluid stream to provide an atomized mixture of gas and liquid streams to the heat exchanger for vaporization.

10. The vaporizer of claim 9 further comprising a valve proximate the mixing point for controlling the introduction of the liquid into the gas stream.

11. The vaporizer of claim 9 wherein the gas slot is heated to reduce the heat required for vaporizing the atomized liquid in the heat exchanger.

12. A vaporizer comprising:
   a heated plate comprising a plurality of first and second slots and having a first face and a second face;
   the first slots being spaced, essentially parallel to one another and formed in one of the faces of the heated plate, the first slots each having a first end and a second end;
   the second slots being spaced and formed in the face of the heated plate having the first slots, and interconnecting adjacent ones of the first slots;
   a sealing member abutting the face of the heated plate having the first and second slots and sealing the first and second slots;
   a liquid inlet aperture in fluidic communication with the first end of the first slots; and
   a vapor outlet aperture in fluid communication with a second end of the first slots, opposite the first end for providing a vapor stream exiting the vaporizer.

13. The vaporizer of claim 12 wherein the first and second slots are formed by etching.

14. The vaporizer of claim 12 wherein a mixture stream of an atomized liquid and a gas are introduced into the liquid inlet.

15. The vaporizer of claim 12 wherein an unmixed and unatomized stream of liquid is introduced into the liquid inlet.

16. The vaporizer of claim 12 wherein the first slots have a first cross-sectional area and the second slots have a second cross-sectional area not less than the first cross-sectional area.

17. The vaporizer of claim 12 configured to be a modular component of an integrated fluid delivery system.

* * * * *